(12) United States Patent
Li et al.

(10) Patent No.: US 9,800,285 B2
(45) Date of Patent: Oct. 24, 2017

(54) CIRCUITS AND METHODS FOR BIASING SWITCH BODY

(71) Applicant: SKYWORKS SOLUTIONS, INC., Woburn, MA (US)

(72) Inventors: Yuan Li, Cedar Rapids, IA (US); Edward F. Lawrence, Marion, IA (US)

(73) Assignee: Skyworks Solutions, Inc., Woburn, WA (US)

( * ) Notice: Subject to any disclaimer, the term of this patent is extended or adjusted under 35 U.S.C. 154(b) by 0 days.

(21) Appl. No.: 15/442,759

(22) Filed: Feb. 27, 2017

(65) Prior Publication Data
US 2017/0250724 A1 Aug. 31, 2017

Related U.S. Application Data

(60) Provisional application No. 62/300,832, filed on Feb. 27, 2016.

(51) Int. Cl.
H04B 1/44 (2006.01)
H04B 1/40 (2015.01)
H03K 17/687 (2006.01)
H04B 1/3827 (2015.01)

(52) U.S. Cl.
CPC ........... *H04B 1/40* (2013.01); *H03K 17/6872* (2013.01); *H04B 1/3827* (2013.01); *H04B 1/44* (2013.01)

(58) Field of Classification Search
CPC ........... H04B 1/40; H04B 1/3827; H04B 1/44
See application file for complete search history.

(56) References Cited

U.S. PATENT DOCUMENTS

| | | | |
|---|---|---|---|
| 2014/0009203 A1* | 1/2014 | Cebi | H03K 17/162 327/379 |
| 2014/0009214 A1* | 1/2014 | Altunkilic | H03K 17/161 327/427 |
| 2014/0227983 A1* | 8/2014 | Clausen | H03K 17/063 455/78 |

* cited by examiner

*Primary Examiner* — Nguyen Vo
(74) *Attorney, Agent, or Firm* — Chang & Hale LLP

(57) ABSTRACT

Described herein are circuits and methods for improving switch performance when overdriving the gate by adding a delay on a PMOS gate voltage such that it can turn on the PMOS during switch state transition to allow charge/discharge of the switch body voltage faster and it can turn off once the process is complete. For example, back-to-back diodes can be used to separate the PMOS gate and drain. This can reduce leakage current and can reduce or eliminate the potential for breakdown of the switch.

20 Claims, 13 Drawing Sheets

US 9,800,285 B2

CIRCUITS AND METHODS FOR BIASING SWITCH BODY

CROSS-REFERENCE TO RELATED APPLICATIONS

This application claims priority to U.S. Provisional Application No. 62/300,832 filed Feb. 27, 2016 and entitled "CIRCUITS AND METHODS FOR BIASING SWITCH BODY," which is expressly incorporated by reference herein in its entirety for all purposes.

BACKGROUND

Field

The present disclosure generally relates to switches and biasing circuits for switch bodies.

Description of Related Art

Switches are an important element of modern wireless devices. The performance of a wireless device can be improved by tailoring or optimizing switch performance. One way to improve switch performance is to overdrive the switch.

SUMMARY

According to a number of implementations, the present disclosure relates to a radio-frequency (RF) switch including a switch field-effect transistor (FET) implemented between first and second nodes, and having a gate and a body. The RF switch also includes a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

In some embodiments, the switch FET is an NMOS device, and the first FET of the bias circuit is a PMOS device such that the source of the first FET is coupled to the body of the switch FET. In further embodiments, the drain of the first FET is coupled to the gate of the switch FET. In further embodiments, the bias circuit further includes a gate resistance implemented between a voltage supply node and the gate of the switch FET. In other further embodiments, the compensation circuit includes a second FET implemented in a second diode configuration such that gate and drain of the second FET are coupled, and a third FET implemented in a third diode configuration such that gate and drain of the third FET are coupled, the second and third FETs arranged such that the gate of the first FET is coupled to the source of the second FET and the drain of the third FET, and the drain of the first FET is coupled to the drain of the second FET and the source of the third FET. In further embodiments, each of the second FET and the third FET is a PMOS device. In further embodiments, the compensation circuit is configured such that when the gate of the switch FET transitions from a low state to a high state, a voltage applied at the gate of the first FET is delayed while a voltage applied at the drain of the first FET is substantially immediate. In further embodiments, the delayed application of the voltage at the gate of the first FET allows the first FET to pass a relatively large current to the body of the switch FET to thereby allow the faster transition of the body of the switch FET from a discharged state to a charged state. In further embodiments, the compensation circuit is further configured such that after the gate voltage of the first FET reaches substantially the drain voltage of the first FET, the first FET shuts itself down. In other further embodiments, the delayed application of the voltage at the gate of the first FET results in a reduced leakage current in the first FET when compared to a bias circuit without the compensation circuit. In further embodiments, the switch FET, the first FET, the second FET, and the third FET are implemented as silicon-on-insulator (SOI) devices.

In some embodiments, the compensation circuit includes a second FET implemented in a second diode configuration such that a gate of the second FET is coupled to the body of the switch FET, and a third FET implemented in a third diode configuration such that gate and drain of the third FET are coupled, the second and third FETs arranged such that the gate of the first FET is coupled to the drain of the second FET and the drain of the third FET, and the drain of the first FET is coupled to the source of the second FET and the source of the third FET. In further embodiments, the second FET is an NMOS device, and the third FET is a PMOS device. In further embodiments, the compensation circuit is configured such that when the gate of the first FET transitions from a high state to a low state, the gate of the first FET is discharged faster due to the presence of the second FET, when compared to a bias circuit without the compensation circuit. In further embodiments, the gate of the second FET being coupled to the body of the switch FET allows the second FET to remain ON longer and thereby discharge the gate of the first FET even faster. In further embodiments, the switch FET, the first FET, the second FET, and the third FET are implemented as silicon-on-insulator (SOI) devices.

In accordance with a number of implementations, described herein is a semiconductor die having a substrate and a radio-frequency (RF) switch circuit implemented on the substrate. The RF switch circuit includes a switch field-effect transistor (FET) having a gate and a body. The RF switch circuit further includes a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

In some embodiments, the die further includes an insulator layer implemented between the switch FET and the substrate. In some embodiments, the semiconductor die is a silicon-on-insulator (SOI) die.

In accordance with a number of implementations, described herein is a method for fabricating a semiconductor die, the method including providing a semiconductor substrate. The method also includes forming a switch field-effect transistor (FET) having a gate and a body on the semiconductor die to yield a radio-frequency (RF) switch. The method also includes forming a bias circuit on the semiconductor die, the bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

In accordance with a number of implementations, described herein is a radio-frequency (RF) module including a packaging substrate configured to receive a plurality of components and a semiconductor die mounted on the packaging substrate. The die includes an RF switch circuit having a switch field-effect transistor (FET) having a gate and a body. The RF switch circuit further includes a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

In some embodiments, the semiconductor die is a silicon-on-insulator (SOI) die. In further embodiments, the RF module is a switching module.

In accordance with a number of implementations, described herein is a wireless device that includes a transceiver configured to process RF signals, an antenna in communication with the transceiver and configured to facilitate either or both of transmit operation and receive operation of the transceiver, and a switching module coupled to the antenna and configured to selectively route RF signals associated with the antenna. The switch module includes an RF switch circuit having a switch field-effect transistor (FET) having a gate and a body, the RF switch circuit further including a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In many radio-frequency (RF) applications, performance of a switch can be improved by overdriving its gate, in excess of a threshold bias voltage applied to the gate. For example, such an overdrive voltage (Vov) can be expressed as Vov=Vgs−Vt, where Vgs is a voltage between the gate and a source of the switch transistor, and Vt is the threshold gate bias voltage. However, when such an overdrive voltage applied to the gate is increased, there can be undesirable effects.

For example, suppose that an NMOS FET device is being utilized as a switch, and a gate overdrive voltage is being increased from 2.5V to 3.3V to improve switching performance. Suppose further that the NMOS FET also has its body biased with a gate bias voltage passed through a diode-connected PMOS FET. Examples related to such a configuration are described herein in reference to FIG. 3.

In such an example configuration, problems can arise when the gate of the switch (NMOS) transitions from a low state (e.g., −2.2V) to a high state (e.g., 3.3V). For example, the body-biasing PMOS diode can have its gate-to-source (Vgs) and drain-to-source (Vds) voltages above 4V for a relatively long period, and under such a condition, the PMOS diode can break down. In another example, the PMOS diode can suffer from a relatively large leakage current.

Figure 1:
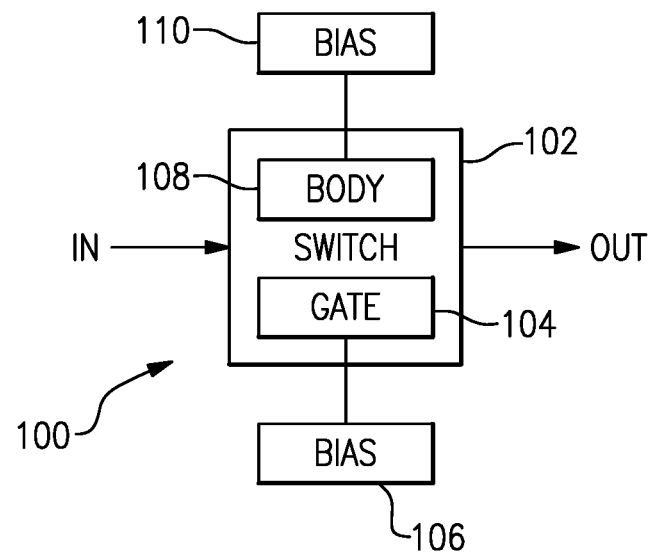
FIG. 1 shows a block diagram of a switching configuration in which a switch (e.g., a FET device) includes a gate and a body.

Among others, described herein are various examples related to how a switching transistor can be configured so that its body can be biased effectively, even with application of an overdrive voltage to its gate. FIG. 1 shows a block diagram of a switching configuration 100 in which a switch (e.g., a FET device) 102 includes a gate 104 and a body 108. In such a switch, a signal such as an RF signal can be allowed to pass between source and drain of the switch.

In the example of FIG. 1, the gate 104 is shown to be provided with its bias voltage from a bias circuit 106. The body 108 is shown to be provided with its bias voltage from a bias circuit 110.

Figure 2:
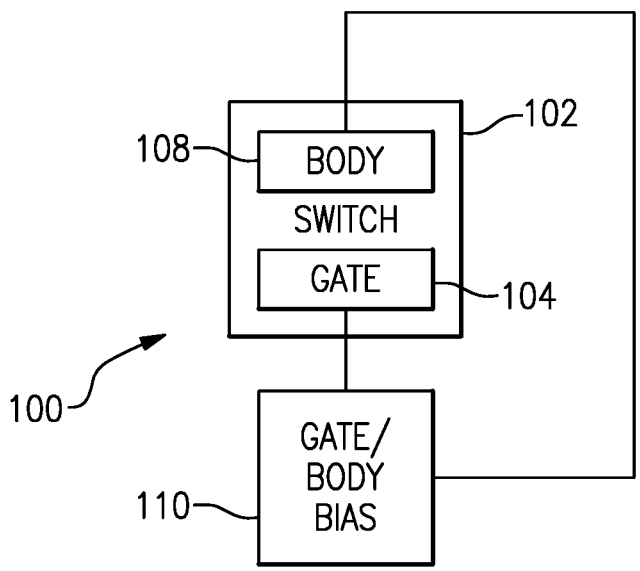
FIG. 2 shows a switching configuration where a bias circuit can include biasing functionality for both of the gate and the body.

In some embodiments, at least some portions of the biasing circuits of the gate bias circuit (106 in FIG. 1) and the body biasing circuit (110 in FIG. 1) can be shared or combined. Accordingly, FIG. 2 shows a switching configuration 100 where a bias circuit 110 can include biasing functionality for both of the gate 104 and the body 108. Examples related to such a gate/body bias circuit (110) are described herein in greater detail.

Figure 3:
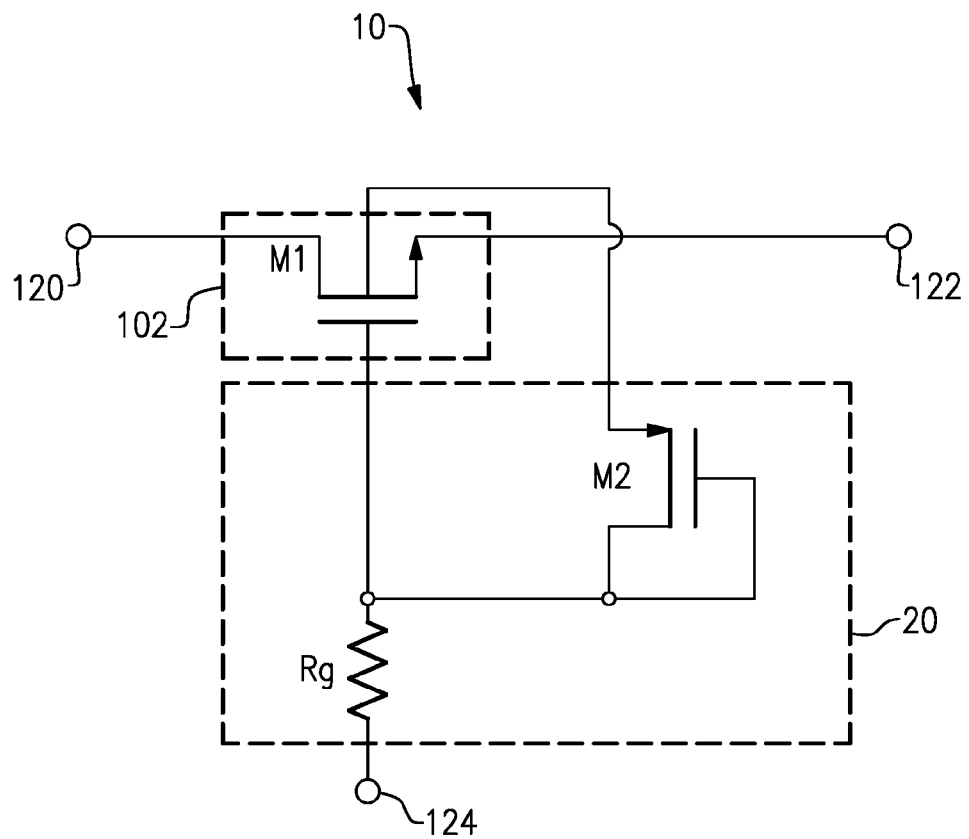
FIG. 3 shows a switching configuration in which an NMOS FET is implemented between two nodes

FIG. 3 shows a switching configuration 10 in which an NMOS FET (M1) is implemented between first and second nodes 120, 122. The first node 120 is shown to be coupled to a drain of M1, and the second node 122 is shown to be coupled to a source of M1. The first node 120 can be an input node for an RF signal, and the second node 122 can be an output for the RF signal.

In the example of FIG. 3, the RF signal can be allowed to pass through M1 by application of a bias voltage at a gate of M1 to yield an ON state. Accordingly, when M1 is ON, the RF signal can pass between the first and second nodes 120, 122. When M1 is OFF by removal of the gate bias voltage, the RF signal is substantially inhibited from passing from the first node 120 to the second node 122.

In the example of FIG. 3, the gate of M1 is shown to be provided with a gate voltage Vg from a voltage node 124 through a gate resistance Rg. In some embodiments, the gate voltage Vg can also be provided to a body of M1 through a PMOS device M2 configured as a diode. It will be understood that the voltage delivered to the body of M1 may or may not be the same as the voltage Vg delivered to the gate of M1.

In the example of FIG. 3, a circuit indicated as 20 can be a gate/body bias circuit that utilizes a common voltage node to provide bias voltages to the gate and body of the switching NMOS FET M1.

In various examples described herein, switching FETs (e.g., M1 in FIGS. 3-5) are described as being NMOS devices. However, it will be understood that one or more features of the present disclosure can also be implemented in applications where switching FETs are implemented as PMOS devices. Such a configuration can be accommodated by, for example, voltage levels different than those associated with NMOS switching devices.

Referring to the example of FIG. 3, it is noted that when the gate of M1 is provided with an overdrive bias voltage (e.g., 3.3V), there are potential issues that may arise. For example, the body-biasing PMOS device (M2) can have gate-source (Vgs) and drain-source (Vds) voltages above 4V for a relatively long period (e.g. hundreds of μs) when the gate voltage of M1 transitions from a low state (e.g., −2.2V) to a high state (e.g., 3.3V). In another example, the body-biasing PMOS device (M2) can suffer from a relatively large leakage current (e.g., about 10 μA).

Figure 6:
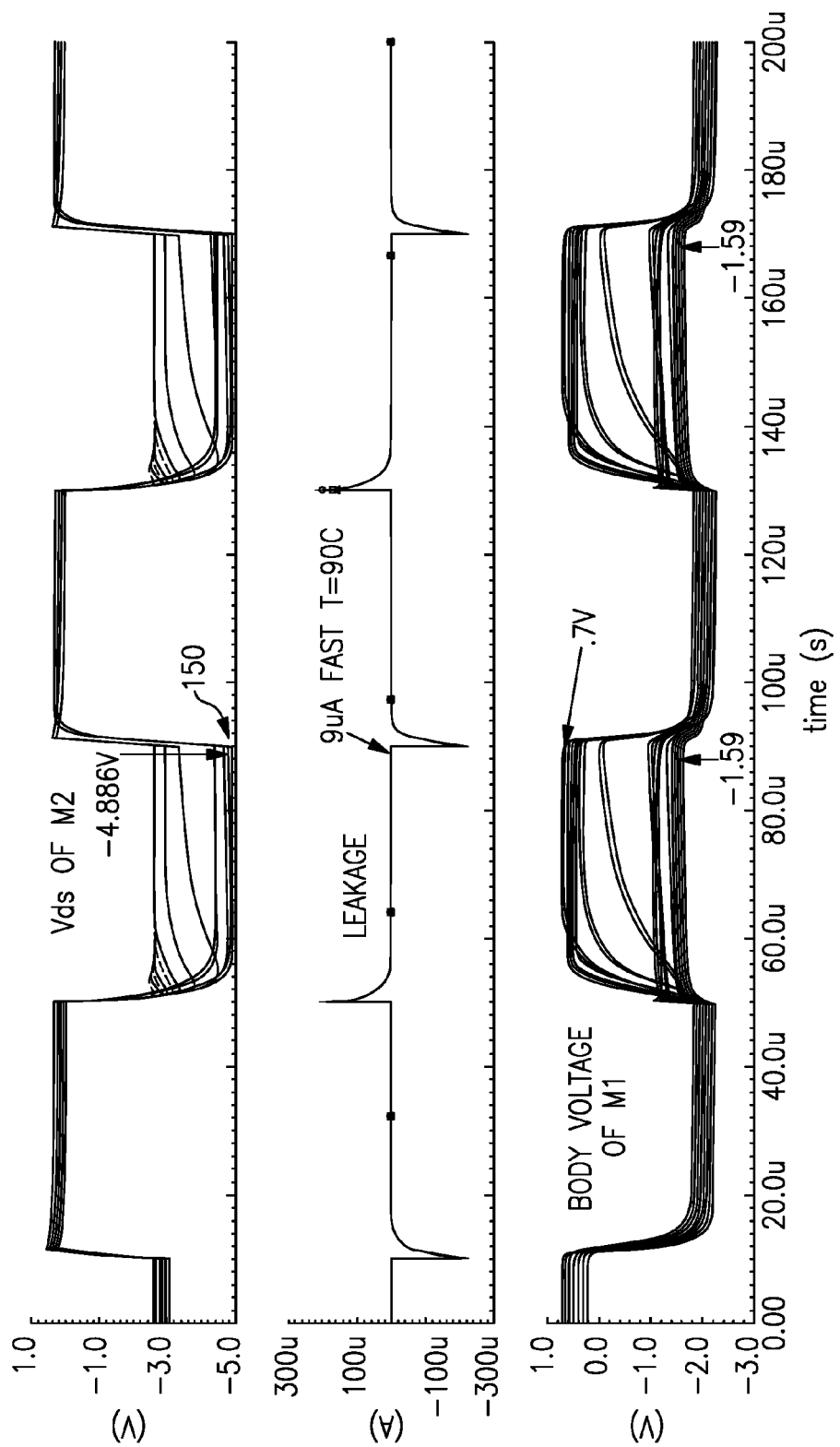
FIG. 6 shows plots demonstrating issues associated with overdriving a gate of a switch.

FIG. 6 shows examples of the foregoing issues associated with M2 resulting from application of the overdrive voltage to the gate of M1. In FIG. 6, the top plot shows a number of Vds signals of M2 as a function of time as M1 is turned ON and OFF by application of the example overdrive gate bias voltage of 3.3V. The middle plot shows a number of leakage current of M2 as a function of the same time scale. The bottom plot shows a number of body voltage signals applied to M1 as a function of the same time scale. In the example of FIG. 6, the number of signals in the three plots correspond to simulations of the M1 and M2 devices at various process corners (fast-fast, slow-slow, fast-slow, slow-fast) operated at various temperatures (−30 degree C., 27 degree C., 90 degree C.).

Referring to the Vds plot (top plot of FIG. 6), one can see that the low state of Vds of M2 can vary greatly, depending on the process corner and/or temperature conditions. Such a variation in Vds can include a relatively large voltage magnitude as much as 4.886V at time indicated as 150. Such a voltage can lead to a breakdown of M2.

Referring to the leakage current plot (middle plot of FIG. 6), one can see that a prolonged leakage of approximately 9 μA (e.g., for the fast-fast corner operated at 90 degree C.) can exist.

Referring to the M1 body voltage plot (bottom plot of FIG. 6), one can see that the body voltage applied to M1 can also vary greatly (e.g., between approximately −1.59V and 0.7V), depending on the process corner and/or temperature conditions. Such variation in body voltage applied to M1 are shown to generally coincide with the variation of Vds of M2 during the low state of Vds.

It is noted that in some embodiments, the leakage current problem for M2 can be mitigated by increasing M2's channel length. However, such an increase in channel length can worsen the problem of large Vds values.

Figure 4:
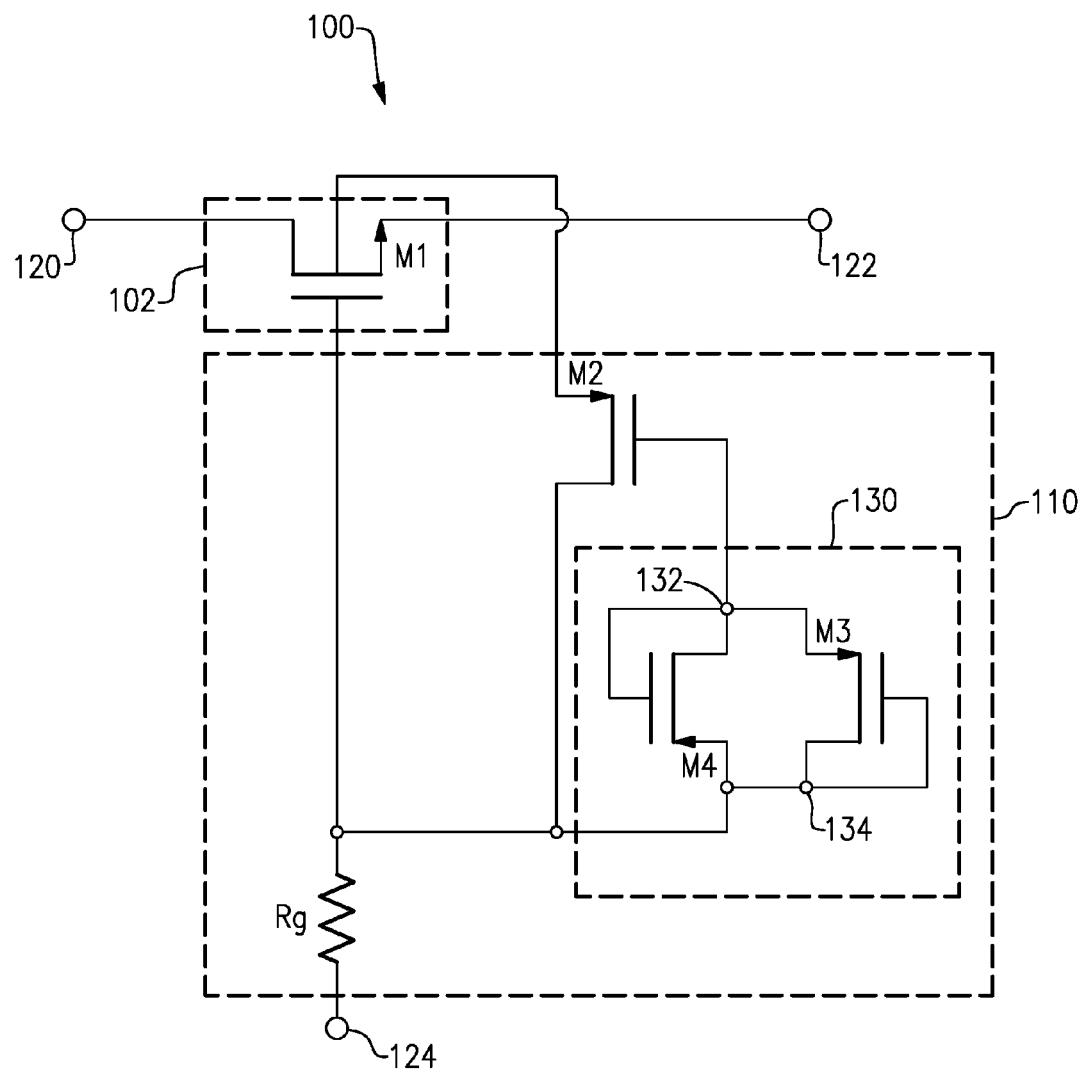
FIG. 4 shows an example switching configuration that includes a compensation circuit that can be configured to couple the gate and drain of a PMOS device.
Figure 5:
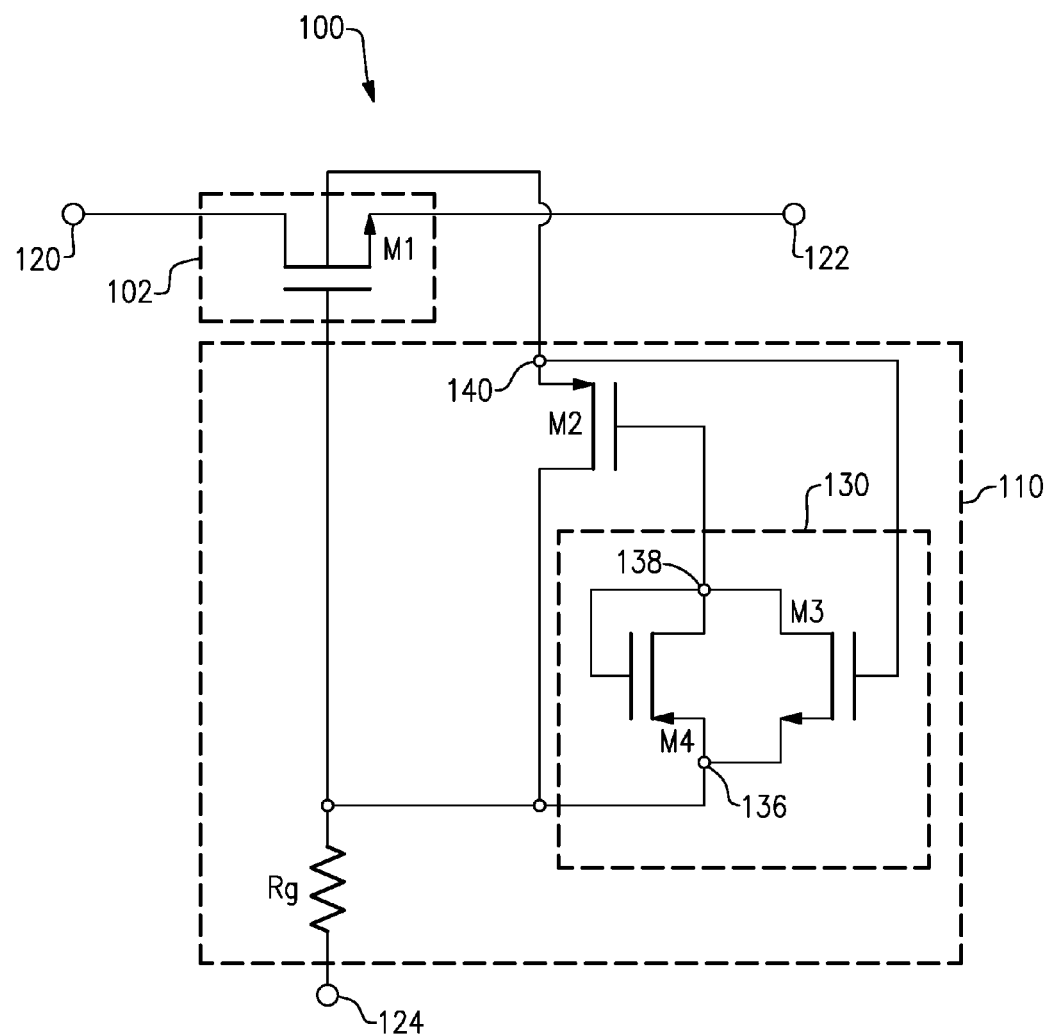
FIG. 5 shows another example switching configuration that includes a compensation circuit that can be configured to couple the gate, drain, and source of a PMOS device.

FIGS. 4 and 5 show non-limiting examples of how a gate/body bias circuit 110 can be configured to provide a desirable body-biasing functionality for a switching transistor M1 collectively indicated as 102. For the purpose of description, M1 and its relation to the nodes 120, 122 can be similar to the example of FIG. 3. Also similar to the example of FIG. 3, the gate of M1 can be provided with a bias voltage Vg from a voltage node 124 through a gate resistance Rg.

In a first example switching configuration 100 of FIG. 4, a compensation circuit 130 can be configured to couple the gate and drain of a PMOS device M2. More particularly, a diode based on a PMOS device M3 is shown to be implemented such that the source of M3 is coupled to the gate node (132) of M2, and the gate and drain of M3 are coupled to each other. A diode based on a PMOS device M4 is shown to be implemented such that the source of M4 is coupled to the gate/drain node (134) of M3, and the gate and drain of M4 are coupled to each other at the gate node 132. The gate/drain node (134) of M3 (which is also the source node of M4) is shown to be coupled to the gate of the NMOS switch transistor M1.

Configured in the foregoing manner, the diodes based on M3 and M4 form a back-to-back arrangement that can act like an adaptive resistor. For example, when the gate of M1 is made to transition from a low state to a high state, the drain voltage of M2 transitions to a high state substantially right away, but the voltage applied to the gate of M2 will be delayed and stay in a low state for some duration. Such a delay can allow M2 to pass a relatively large current to charge the body of M1 relatively fast, and such fast charging can limit the source-drain voltage (Vds) of M2. Then, the gate voltage of M2 can charge to drain voltage and then shut itself down.

In some embodiments, increasing the channel length of M2 can reduce the leakage further; however, such a change can degrade the breakdown performance. It is also noted that making the diodes M3, M4 stronger can also reduce the leakage current; however, such a change can also degrade the breakdown performance.

Figure 7:
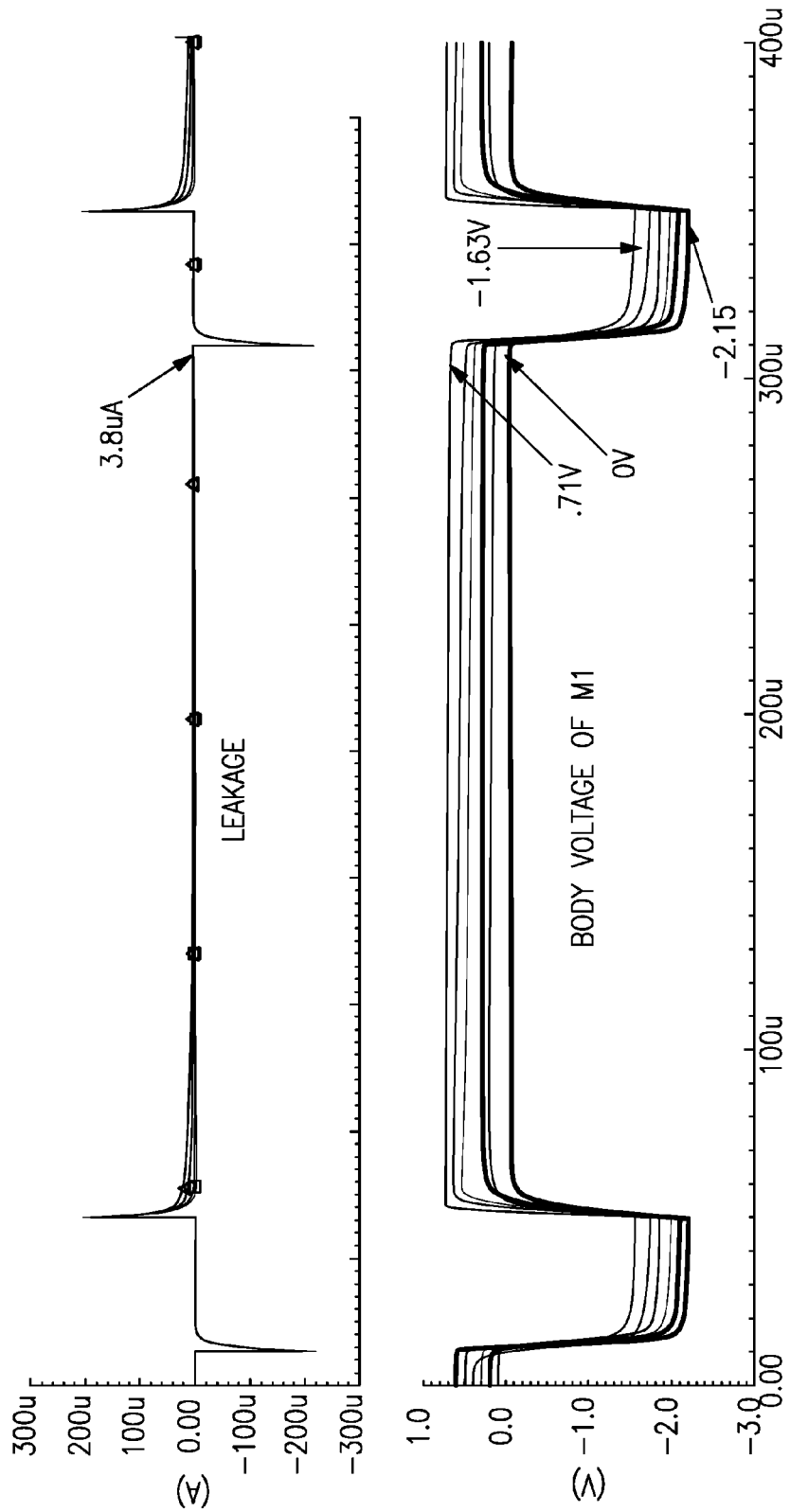
FIG. 7 shows examples of leakage current of a transistor and body voltage applied to a second transistor, for the example configuration illustrated in FIG. 4.

FIG. 7 shows examples of leakage current of M2 and body voltage applied to M1, for the example configuration of FIG. 4. More particularly, the top plot shows a number of leakage current of M2 as a function of time as M1 is turned ON and OFF by application of the example overdrive gate bias voltage of 3.3V. The bottom plot shows a number of body voltage signals applied to M1 as a function of the same time scale. In the example of FIG. 7, the number of signals in the two plots correspond to simulations of the M1 and M2 devices at various process corners (fast-fast, slow-slow, fast-slow, slow-fast) operated at various temperatures (−30 degree C., 27 degree C., 90 degree C.).

Referring to the leakage current plot (top plot of FIG. 7), one can see that a generally uniform leakage of approximately 3.8 µA is significantly less than the example 9 µA leakage current of the example of FIGS. 3 and 6.

Referring to the M1 body voltage plot (bottom plot of FIG. 7), one can see that the body voltage applied to M1 is much more consistent during both high and low states. For example, and referring to FIGS. 3 and 6, the high state of body voltage applied to M1 (bottom plot of FIG. 6) is shown to vary between approximately −1.59V and 0.7V. In the example of FIGS. 4 and 7, the high state of body voltage applied to M1 (bottom plot of FIG. 7) is shown to vary between approximately 0V and 0.71, and such a range is much more consistent than that the example of FIGS. 3 and 6.

Also referring to the M1 body voltage plot (bottom plot of FIG. 7), one can also see that the low state of body voltage applied to M1 is fairly consistent (e.g., between approximately −2.15V and −1.63V), and not any worse than the example of FIGS. 3 and 6.

Figure 8:
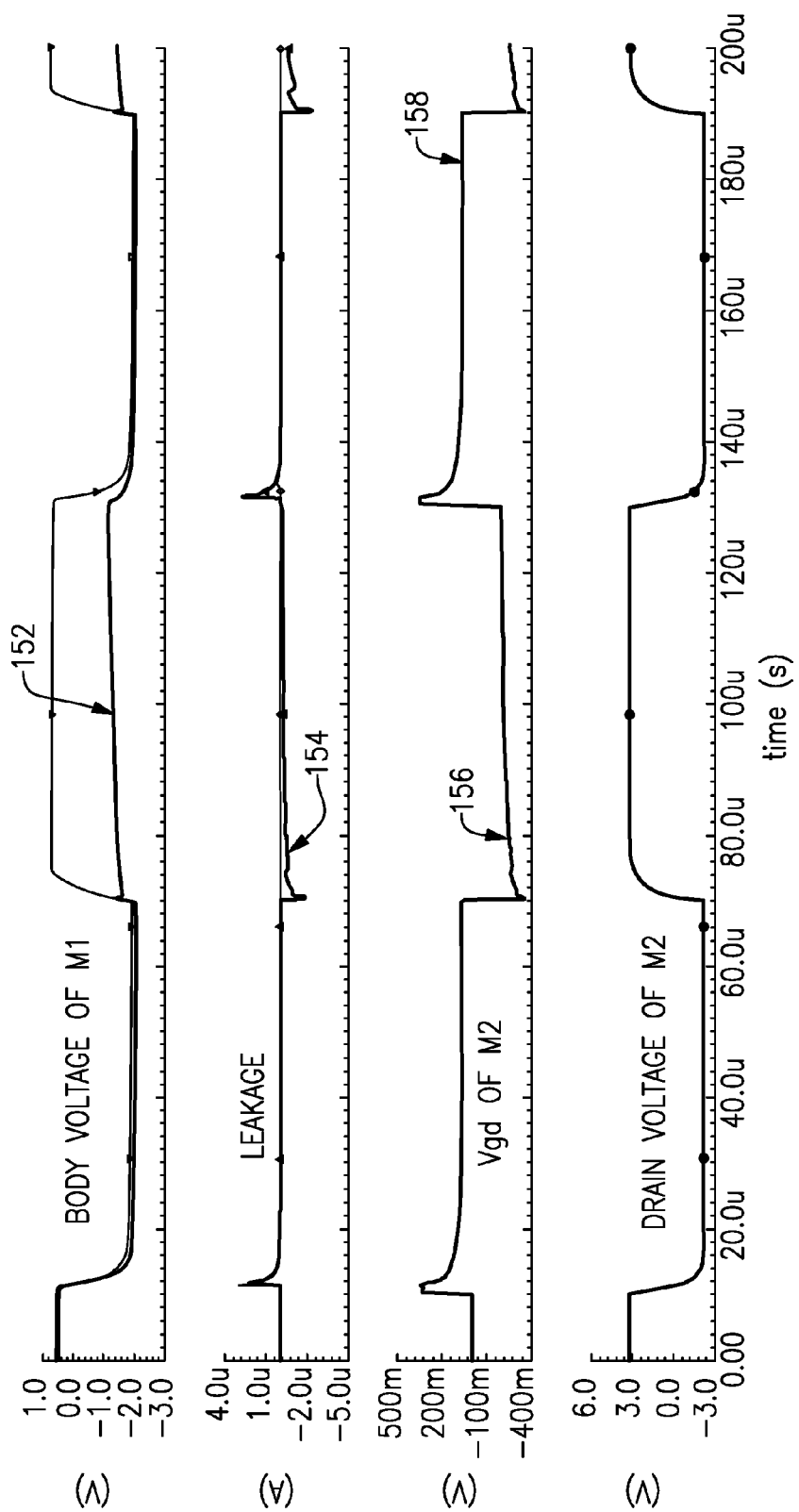
FIG. 8 shows various plots related to how the example configuration of FIG. 3 can reduce or eliminate a breakdown condition associated with a transistor.

FIG. 8 shows various plots related to how the example configuration of FIG. 3 can reduce or eliminate a breakdown condition associated with M2. In FIG. 8, the top plot shows a body voltage signal applied to M1 as a function of time as M1 is turned ON and OFF by application of the example overdrive gate bias voltage of 3.3V, for each of the configurations of FIGS. 3 and 4 for a nominal process corner simulation at 27 degree C. The second-from-the-top plot shows a leakage current of M2 as a function of the same time scale, for each of the configurations of FIGS. 3 and 4 for a nominal process corner simulation at 27 degree C. The second-from-the-bottom plot shows a ground-to-drain voltage (Vgd) of M2 as a function of the same time scale, for the configuration of FIG. 4 for a nominal process corner simulation at 27 degree C. The bottom plot shows a drain voltage of M2 as a function of the same time scale, for each of the configurations of FIGS. 3 and 4 for a nominal process corner simulation at 27 degree C.

Referring to the plots of body voltage signal applied to M1 (top plot of FIG. 8), it is noted that for the configuration of FIG. 4, the body of M1 receives a voltage of approximately 0.65V relatively quickly, while for the configuration of FIG. 3, the body voltage (trace 152) is still at approximately −1.2V after about 60 µs.

Referring to the plots of leakage current of M2 (second-from-top plot of FIG. 8), it is noted that for the configuration of FIG. 4, the leakage current settles from about 1.9 µA to 0.15 µA fairly quickly, while for the configuration of FIG. 3, the leakage current (trace 154) generally remains at a much higher magnitude of about 8 µA.

Referring to the plot of Vgd of M2 (second-from-bottom plot of FIG. 8), it is noted that for the configuration of FIG. 4, Vgd varies between about −0.35V and −0.2V when the body voltage of M1 is in a high state, and has a value that settles at about 0.060V when the body voltage of M1 is in a low state. For the configuration of FIG. 3, it is noted that Vgd stays at approximately 0V when the body voltage of M1 is in a high state.

Referring to the plots of drain voltage of M2 (bottom plot of FIG. 8), it is noted that such a voltage behave similarly for the configuration of FIG. 4 and the configuration of FIG. 3.

In a second example switching configuration 100 of FIG. 5, a compensation circuit 130 can be configured to couple the gate, drain and source of a PMOS device M2. More particularly, a diode based on an NMOS device M3 is shown to be implemented such that the drain of M3 is coupled to the gate node (138) of M2, which is also coupled to the gate and drain of M4. A diode based on a PMOS device M4 is shown to be implemented such that the source of M4 is coupled to the source node (136) of M3. The source node (136) of M3 (which is also the source node of M4) is shown to be coupled to the gate of the NMOS switch transistor M1. The gate of M3 is shown to be coupled to the body node (140) of the NMOS switch transistor M1.

Configured in the foregoing manner, the example bias circuit 110 of FIG. 5 can provide one or more desirable functionalities. For example, when the NMOS switch M1 is made to transition from an ON state to an OFF state, the body voltage typically needs to change from a high state (e.g., above 0V) to a low state (e.g., around −2.2V). Accordingly, it is preferable to have the gate voltage of M2 transition from a high state (e.g., 3.3V) to a low state (e.g., −2.2V) relatively fast. An ideal condition can include a short for the gate of M2. In some embodiments, M3 being an NMOS device in the example of FIG. 5 can allow the gate of M2 to discharge efficiently, to allow the foregoing gate voltage transition to occur faster.

In the example of FIG. 5, it is noted that the gate of the NMOS device M3 is coupled to the body of the NMOS switch transistor M1. In some embodiments, such a configuration can provide some delay which can keep the NMOS device M3 remain on longer and thus discharge the gate of M2 even more efficiently.

Figure 9:
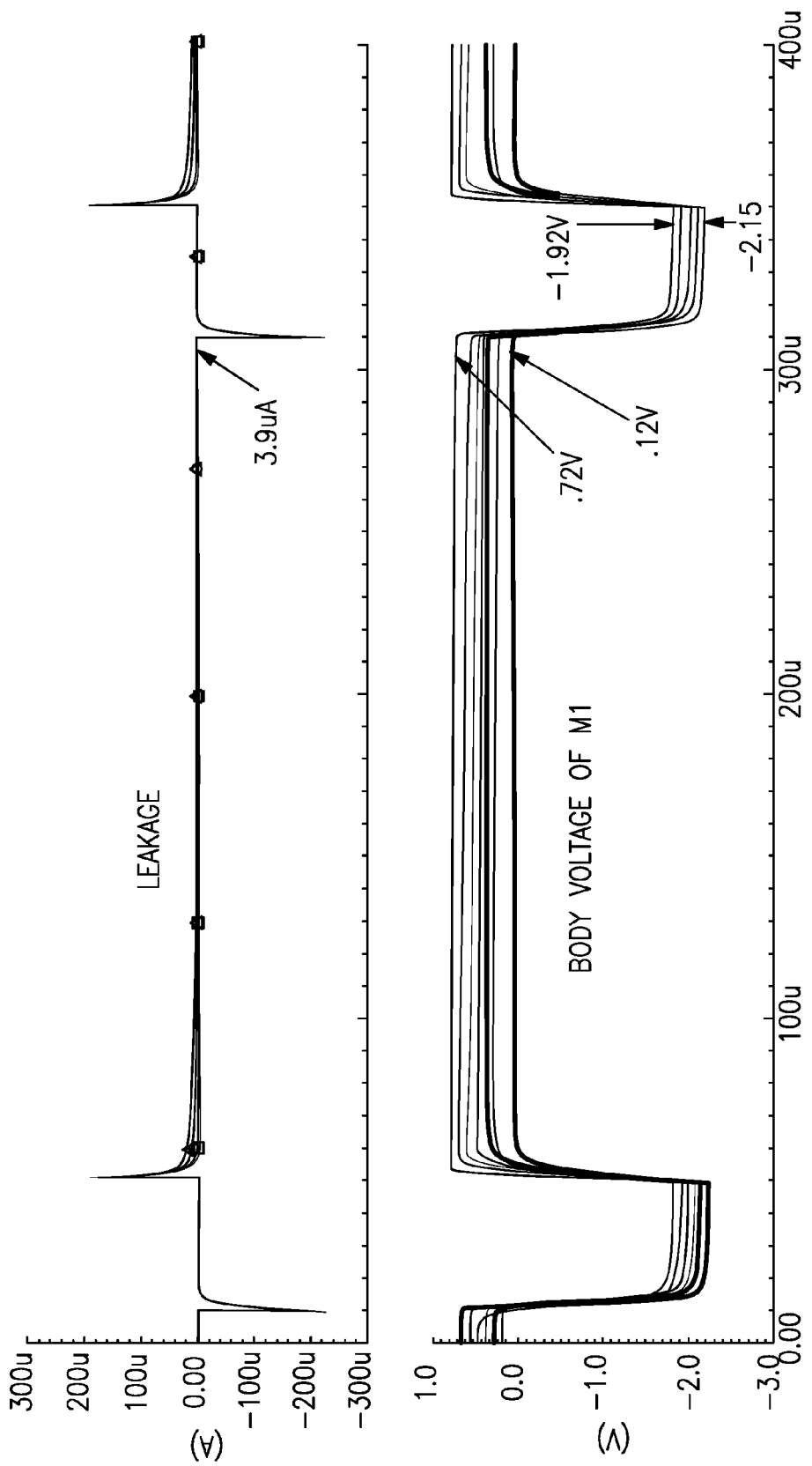
FIG. 9 shows examples of leakage current of a transistor and body voltage applied to a second transistor, for the example configuration illustrated in FIG. 5.

FIG. 9 shows examples of leakage current of M2 and body voltage applied to M1, for the example configuration of FIG. 5. More particularly, the top plot shows a number of leakage current of M2 as a function of time as M1 is turned ON and OFF by application of the example overdrive gate bias voltage of 3.3V. The bottom plot shows a number of body voltage signals applied to M1 as a function of the same time scale. In the example of FIG. 9, the number of signals in the two plots correspond to simulations of the M1 and M2 devices at various process corners (fast-fast, slow-slow, fast-slow, slow-fast) operated at various temperatures (−30 degree C., 27 degree C., 90 degree C.).

Referring to the leakage current plot (top plot of FIG. 9), one can see that a generally uniform leakage of approximately 3.9 µA is significantly less than the example 9 µA leakage current of the example of FIGS. 3 and 6.

Referring to the M1 body voltage plot (bottom plot of FIG. 9), one can see that the body voltage applied to M1 is much more consistent during both high and low states. For example, and referring to FIGS. 3 and 6, the high state of body voltage applied to M1 (bottom plot of FIG. 6) is shown to vary between approximately −1.59V and 0.7V. In the example of FIGS. 5 and 9, the high state of body voltage applied to M1 (bottom plot of FIG. 9) is shown to vary between approximately 0.12V and 0.72, and such a range is much more consistent than that the example of FIGS. 3 and 6.

Also referring to the M1 body voltage plot (bottom plot of FIG. 9), one can also see that the low state of body voltage applied to M1 is fairly consistent (e.g., between approximately −2.13V and −1.92V), and not any worse than the example of FIGS. 3 and 6.

Comparing the example of FIGS. 4 and 7 and the example of FIGS. 5 and 8, it is noted that the body voltage applied to M1 is generally lower in the example of FIGS. 5 and 8 when the switch M1 is OFF, and generally higher in the example of FIGS. 5 and 8 when the switch M1 is ON.

Figure 10:
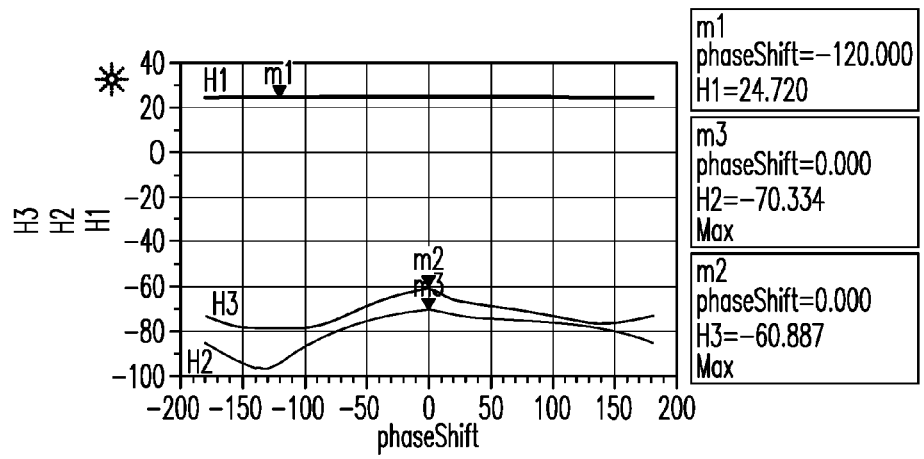
FIG. 10 illustrates first, second, and third harmonics as a function of phase shift for the switching configuration of FIG. 3.
Figure 11:
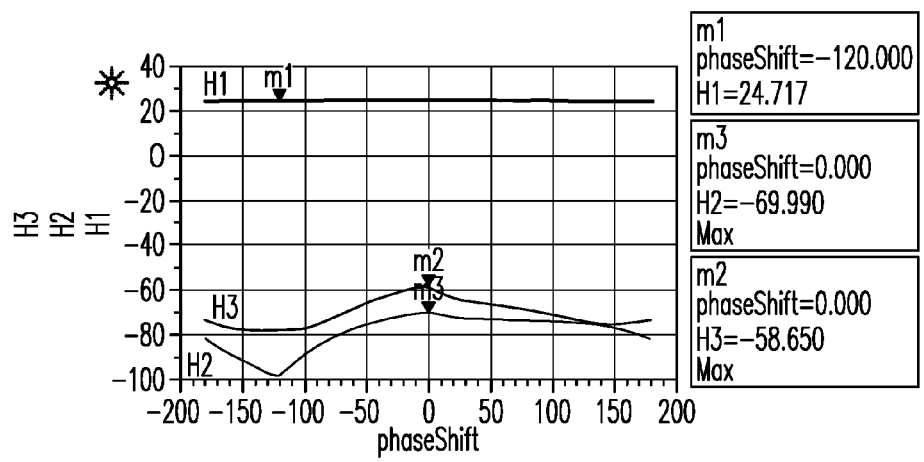
FIG. 11 illustrates first, second, and third harmonics as a function of phase shift for the switching configuration of FIG. 4.
Figure 12:
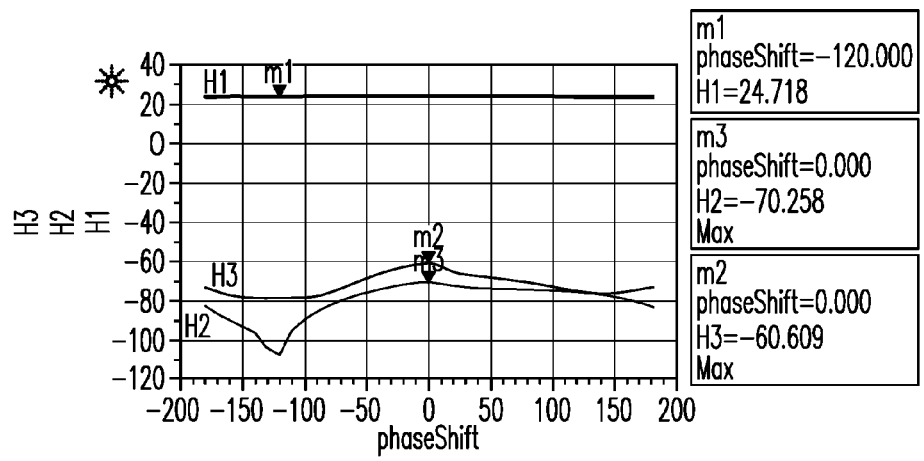
FIG. 12 illustrates first, second, and third harmonics as a function of phase shift for the switching configuration of FIG. 5.
Figure 13:
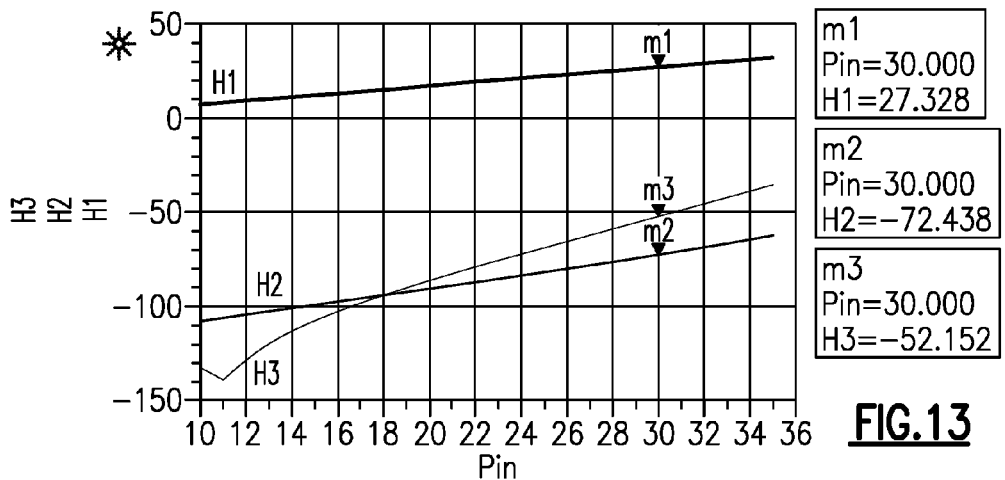
FIG. 13 illustrates first, second, and third harmonics as a function of input power for the switching configuration of FIG. 3.
Figure 14:
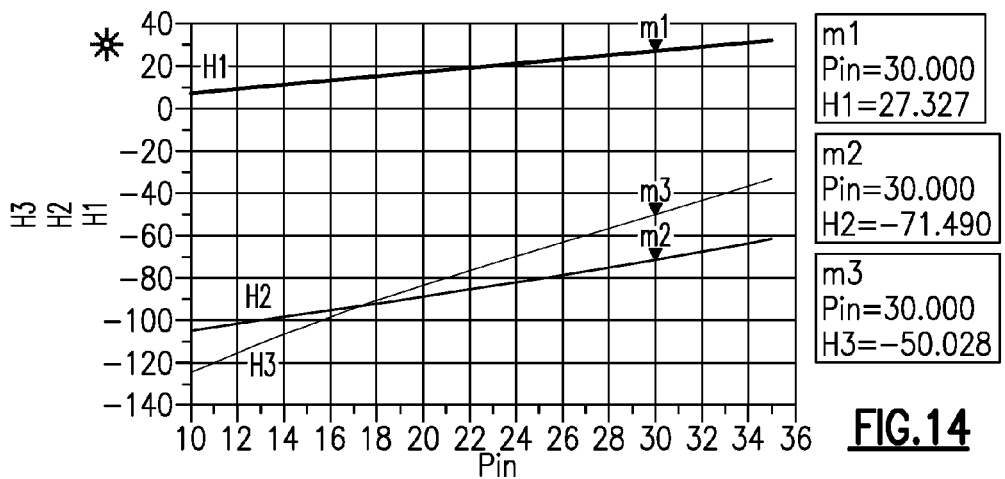
FIG. 14 illustrates first, second, and third harmonics as a function of input power for the switching configuration of FIG. 4.
Figure 15:
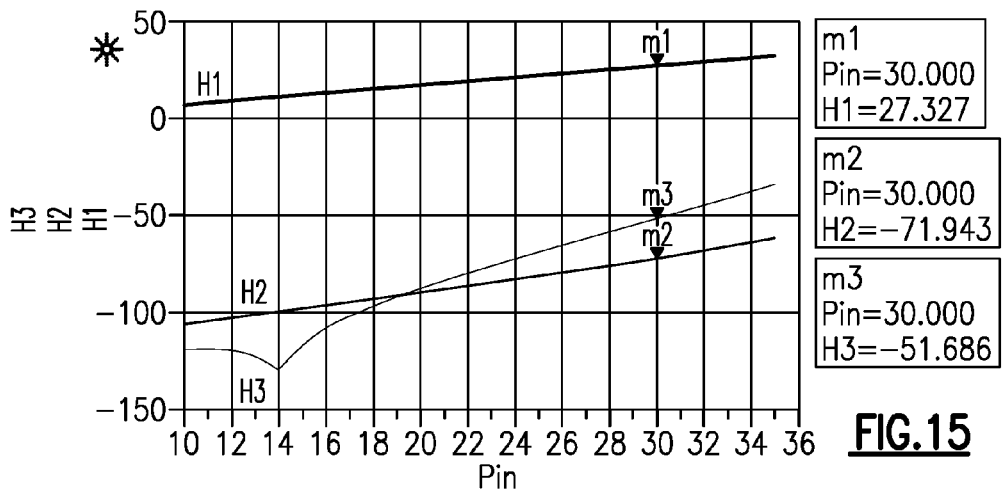
FIG. 15 illustrates first, second, and third harmonics as a function of input power for the switching configuration of FIG. 5.

FIGS. 10-15 show harmonics related performance examples for the switching configurations 100 of FIGS. 4 and 5, compared to the switching configuration 10 of FIG. 3. More particularly, FIGS. 10-12 show harmonics plots as a function of phase shift, and FIGS. 13-15 show harmonics plots as a function of input power.

In each of the examples of FIGS. 10-12, first (H1), second (H2) and third (H3) harmonics are plotted as a function of phase shift. In each example, the voltage standing wave ratio (VSWR) is approximately 5, and the input power Pin is approximately 27.5 dBm. FIG. 10 is for the switching configuration 10 of FIG. 3, in which the gate of the PMOS device M2 has a length of approximately 0.28 μm. FIG. 11 is for the switching configuration 100 of FIG. 4, in which the gate of the PMOS device M2 has a length of approximately 0.5 μm. FIG. 12 is for the switching configuration 100 of FIG. 5, in which the gate of the PMOS device M2 has a length of approximately 0.5 μm.

Referring to the plots of FIGS. 10 (representative of the switching configuration 10 of FIG. 3) and 11 (representative of the switching configuration 100 of FIG. 4), it is noted that the second harmonic (H2) in the switching configuration 100 of FIG. 4 is degraded by about 0.3 dB, and the third harmonic (H3) in the switching configuration 100 of FIG. 4 is degraded by about 2.2 dB, when compared to the switching configuration 10 of FIG. 3.

Referring to the plots of FIGS. 10 (representative of the switching configuration 10 of FIG. 3) and 12 (representative of the switching configuration 100 of FIG. 5), it is noted that the third harmonic (H3) in the switching configuration 100 of FIG. 5 is degraded by about 0.3 dB, when compared to the switching configuration 10 of FIG. 3.

Based on the foregoing examples, it is noted that harmonics related performance is not degraded significantly when compensation circuits 130 of FIGS. 4 and 5 are implemented. As described herein, such compensation circuits can provide a number of advantageous features.

In each of the examples of FIGS. 13-15, first (H1), second (H2) and third (H3) harmonics are plotted as a function of input power Pin. In each example, VSWR is approximately 5, and the phase is approximately 0 degree. FIG. 13 is for the switching configuration 10 of FIG. 3, in which the gate of the PMOS device M2 has a length of approximately 0.28 μm. FIG. 14 is for the switching configuration 100 of FIG. 4, in which the gate of the PMOS device M2 has a length of approximately 0.5 μm. FIG. 15 is for the switching configuration 100 of FIG. 5, in which the gate of the PMOS device M2 has a length of approximately 0.5 μm.

Referring to the plots of FIGS. 13 (representative of the switching configuration 10 of FIG. 3) and 14 (representative of the switching configuration 100 of FIG. 4), it is noted that the second harmonic (H2) in the switching configuration 100 of FIG. 4 is degraded by about 1 dB, and the third harmonic (H3) in the switching configuration 100 of FIG. 4 is degraded by about 2 dB, when compared to the switching configuration 10 of FIG. 3.

Referring to the plots of FIGS. 13 (representative of the switching configuration 10 of FIG. 3) and 15 (representative of the switching configuration 100 of FIG. 5), it is noted that the second harmonic (H2) in the switching configuration 100 of FIG. 5 is degraded by about 0.5 dB, and the third harmonic (H3) in the switching configuration 100 of FIG. 5 is degraded by about 0.4 dB, when compared to the switching configuration 10 of FIG. 3.

Based on the foregoing examples, it is noted that harmonics related performance is not degraded significantly when compensation circuits 130 of FIGS. 4 and 5 are implemented. As described herein, such compensation circuits can provide a number of advantageous features.

In the examples described herein in reference to FIGS. 4 and 5, and their respective performance plots in FIGS. 7-9, the diodes based on M3 and M4 of the compensation circuits 130 can be significantly smaller than the size of M2. For example, M2, M3 and M4 of FIG. 4 that yield the plots of FIGS. 7 and 8 have dimensions listed in Table 1; and M2, M3 and M4 of FIG. 5 that yield the plots of FIG. 9 have dimensions listed in Table 2.

TABLE 1

| Diode | Dimensions |
|---|---|
| M2 (PMOS) | 6.0 μm/0.5 μm |
| M3 (PMOS) | 0.8 μm/0.6 μm |
| M4 (PMOS) | 0.8 μm/0.6 μm |

TABLE 2

| Diode | Dimensions |
|---|---|
| M2 (PMOS) | 6.0 μm/0.5 μm |
| M3 (NMOS) | 0.3 μm/0.28 μm |
| M4 (PMOS) | 0.8 μm/1.0 μm |

As described herein, addition of relatively small diodes (M3 and M4) in series with the gate of the PMOS device M2 introduces edge sensitive delays which help to quickly charge/discharge the substrate node to avoid large Vgs/Vds conditions without increasing leakage. Such small diodes are relatively easy to implement in a layout of a switch biasing circuit, and can introduce high resistance characteristic in a relatively small area.

As also described herein, a compensation circuit (e.g., 130 in FIG. 4 or 5) can eliminate or reduce breakdown concerns for a body-biasing diode (M2) without degrading harmonics performance.

In various examples described herein, a switch 102 such as those in FIGS. 3-5 is depicted as a single FET. However, it will be understood that a switch that can be biased as described herein can include a plurality of FET devices arranged in series, in parallel, or any combination thereof.

Figure 16:
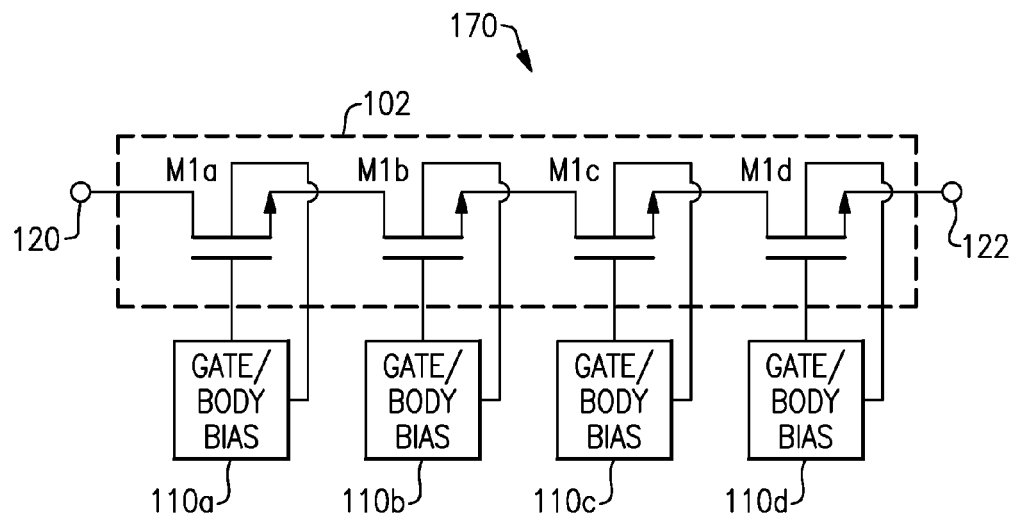
FIGS. 16 and 17 show non-limiting examples of how a plurality of FET devices arranged in series to form a stack can be biased.
Figure 17:
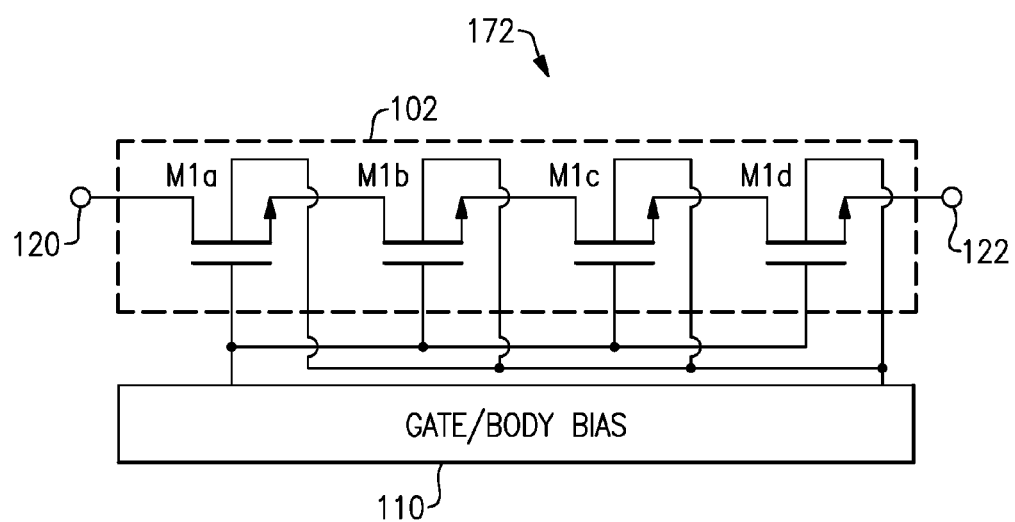

In the example context of a plurality of FET devices arranged in series to form a stack, FIGS. 16 and 17 show non-limiting examples of how such a stack-configuration switch can be biased with a circuit having one or more features described herein. In both of the examples of FIGS. 16 and 17, a switch 102 is shown to include four FET devices arranged in series between first and second nodes 120, 122. More particularly, a drain of the first FET (M1a) is shown to be coupled to the first node 120, and a source of M1a is shown to be coupled to a drain of the second FET (M1b). Similarly, a source of M1b is shown to be coupled to a drain of the third FET (M1c), and a source of M1c is shown to be coupled to a drain of the fourth FET (M1d). A source of M1d is shown to be coupled to the second node 122.

FIG. 16 shows that in some embodiments, gate and body of each of the four FET devices can be biased by a separate biasing circuit. Thus, a bias circuit 110a can bias M1a, a circuit 110b can bias M1b, a bias circuit 110c can bias M1c, and a bias circuit 110d can bias M1d.

FIG. 17 shows that in some embodiments, gate and body of each of the four FET devices can be biased by a common biasing circuit. Thus, each of M1a, M1b, M1c and M1d can be biased by a common biasing circuit 110.

It will be understood that in some embodiments, biasing of FET devices in a stack configuration can be implemented in other ways, including some combination of the examples of FIGS. 16 and 17. It will also be understood that a switch having a stack configuration can also include other numbers of FET devices.

Various examples of FET-based switch circuits and bias/coupling configurations described herein can be implemented in a number of different ways and at different product levels. Some of such product implementations are described by way of examples.

Figure 18:
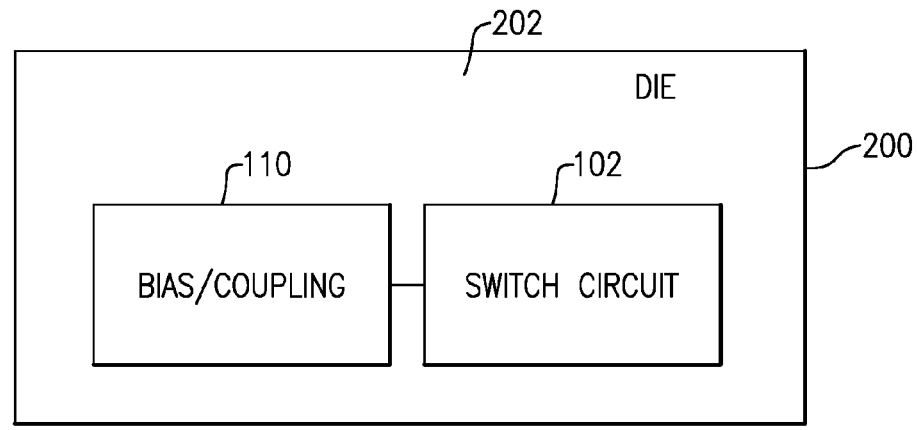
FIG. 18 shows that a switch circuit and a bias/coupling circuit having one or more features as described herein can be implemented on a die.

FIG. 18 shows that in some embodiments, a switch circuit 102 and a bias/coupling circuit 110 having one or more features as described herein can be implemented on a die 200. Such a die can include a substrate such as, for example, a silicon-on-insulator (SOI) substrate configured to allow formation of SOI switching devices, bias circuit elements, or any combination thereof, so as to yield a switching configuration having one or more features as described herein.

Figure 19:
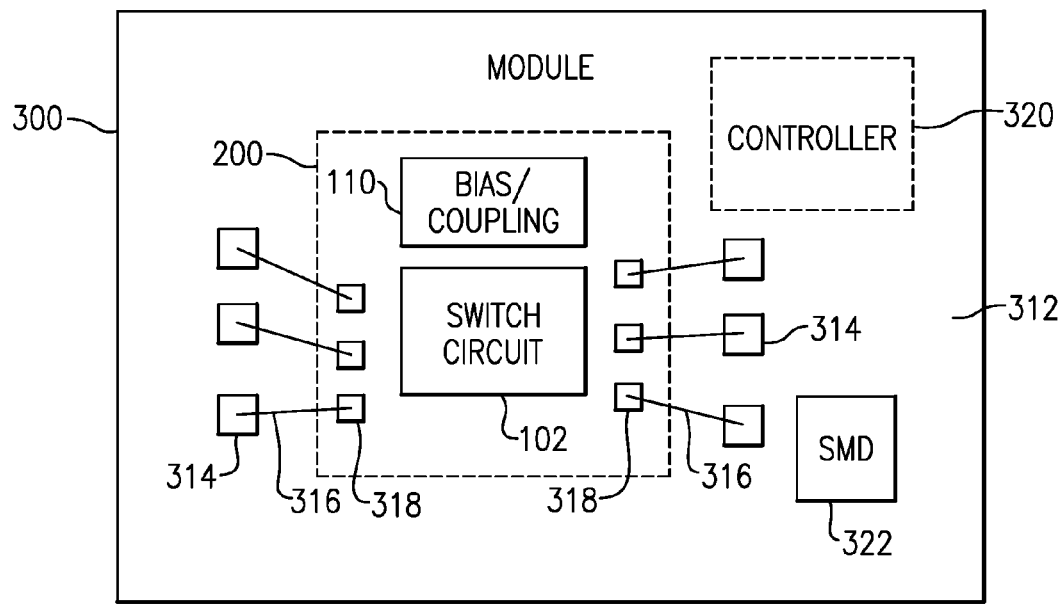
FIG. 19 shows that one or more die having one or more features described herein can be implemented on a packaged module.

In some embodiments, one or more die having one or more features described herein can be implemented in a packaged module. An example of such a module is shown in FIG. 19. Although described in the context of both of the switch circuit and the bias/coupling circuit being on the same die (e.g., example configuration of FIG. 18), it will be understood that packaged modules can be based on other configurations.

A module 300 is shown to include a packaging substrate 312. Such a packaging substrate can be configured to receive a plurality of components, and can include, for example, a laminate substrate. The components mounted on the packaging substrate 312 can include one or more die. In the example shown, a die 200 having a switching circuit 102 and a bias/coupling circuit 110 is shown to be mounted on the packaging substrate 312. The die 200 can be electrically connected to other parts of the module (and with each other where more than one die is utilized) through connections such as connection-wirebonds 316. Such connection-wirebonds can be formed between contact pads 318 formed on the die 200 and contact pads 314 formed on the packaging substrate 312. In some embodiments, one or more surface mounted devices (SMDs) 322 can be mounted on the packaging substrate 312 to facilitate various functionalities of the module 300.

In some embodiments, the packaging substrate 312 can include electrical connection paths for interconnecting the various components with each other and/or with contact pads for external connections. In some embodiments, a space above the packaging substrate 312 and the various components mounted thereon can be filled with an overmold structure. Such an overmold structure can provide a number of desirable functionalities, including protection for the components and wirebonds from external elements, and easier handling of the packaged module 300.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 20:
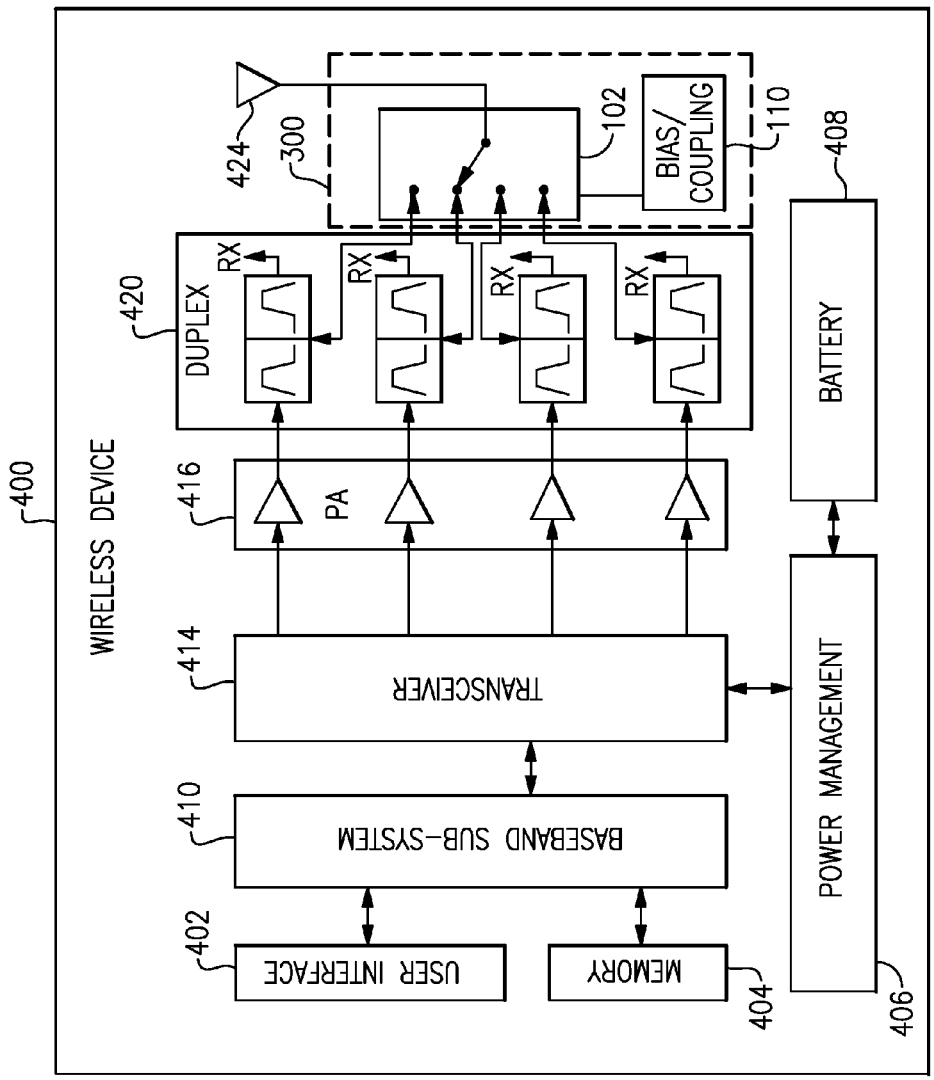
FIG. 20 schematically depicts an example wireless device having one or more advantageous features described herein.

FIG. 20 schematically depicts an example wireless device 400 having one or more advantageous features described herein. In the context of various switches and various biasing/coupling configurations as described herein, a switch 102 and a bias/coupling circuit 110 can be part of a module 300 such as an antenna switch module. In some embodiments, such a switch module can facilitate, for example, multi-band multi-mode operation of the wireless device 400.

In the example wireless device 400, a power amplifier (PA) module 416 having a plurality of PAs can provide an amplified RF signal to the switch 102 (via a duplexer 420), and the switch 102 can route the amplified RF signal to an antenna 424. The PA module 416 can receive an unamplified RF signal from a transceiver 414 that can be configured and operated in known manners. The transceiver can also be configured to process received signals. The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400. Such a power management component can also control operations of the baseband sub-system 410 and the module 300.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

In some embodiments, the duplexer 420 can allow transmit and receive operations to be performed simultaneously using a common antenna (e.g., 424). In FIG. 20, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

In some embodiments, one or more features of the present disclosure can be utilized with switches implemented as silicon-on-insulator (SOI) devices. Among others, additional details concerning such SOI devices, as well as product implementations based on such SOI devices, can be found in U.S. Pat. No. 8,922,268 entitled "Adjustable gate and/or body resistance for improved intermodulation distortion performance of radio-frequency switch," issued Dec. 30, 2014, the entirety of which is incorporated by reference herein for all purposes.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) switch comprising:
a switch field-effect transistor (FET) implemented between first and second nodes, and having a gate and a body; and
a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

2. The RF switch of claim 1 wherein the switch FET is an NMOS device, and the first FET of the bias circuit is a PMOS device such that the source of the first FET is coupled to the body of the switch FET.

3. The RF switch of claim 2 wherein the drain of the first FET is coupled to the gate of the switch FET.

4. The RF switch of claim 3 wherein the bias circuit further includes a gate resistance implemented between a voltage supply node and the gate of the switch FET.

5. The RF switch of claim 3 wherein the compensation circuit includes a second FET implemented in a second diode configuration such that gate and drain of the second FET are coupled, and a third FET implemented in a third diode configuration such that gate and drain of the third FET are coupled, the second and third FETs arranged such that the gate of the first FET is coupled to the source of the second FET and the drain of the third FET, and the drain of the first FET is coupled to the drain of the second FET and the source of the third FET.

6. The RF switch of claim 5 wherein each of the second FET and the third FET is a PMOS device.

7. The RF switch of claim 6 wherein the compensation circuit is configured such that when the gate of the switch FET transitions from a low state to a high state, a voltage applied at the gate of the first FET is delayed while a voltage applied at the drain of the first FET is substantially immediate.

8. The RF switch of claim 7 wherein the delayed application of the voltage at the gate of the first FET allows the first FET to pass a relatively large current to the body of the switch FET to thereby allow the faster transition of the body of the switch FET from a discharged state to a charged state.

9. The RF switch of claim 8 wherein the compensation circuit is further configured such that after the gate voltage of the first FET reaches substantially the drain voltage of the first FET, the first FET shuts itself down.

10. The RF switch of claim 8 wherein the delayed application of the voltage at the gate of the first FET results in a reduced leakage current in the first FET when compared to a bias circuit without the compensation circuit.

11. The RF switch of claim 10 wherein the switch FET, the first FET, the second FET, and the third FET are implemented as silicon-on-insulator (SOI) devices.

12. The RF switch of claim 3 wherein the compensation circuit includes a second FET implemented in a second diode configuration such that a gate of the second FET is coupled to the body of the switch FET, and a third FET implemented in a third diode configuration such that gate and drain of the third FET are coupled, the second and third FETs arranged such that the gate of the first FET is coupled to the drain of the second FET and the drain of the third FET, and the drain of the first FET is coupled to the source of the second FET and the source of the third FET.

13. The RF switch of claim 12 wherein the second FET is an NMOS device, and the third FET is a PMOS device.

14. The RF switch of claim 13 wherein the compensation circuit is configured such that when the gate of the first FET transitions from a high state to a low state, the gate of the first FET is discharged faster due to the presence of the second FET, when compared to a bias circuit without the compensation circuit.

15. The RF switch of claim 14 wherein the gate of the second FET being coupled to the body of the switch FET allows the second FET to remain ON longer and thereby discharge the gate of the first FET even faster.

16. The RF switch of claim 15 wherein the switch FET, the first FET, the second FET, and the third FET are implemented as silicon-on-insulator (SOI) devices.

17. A semiconductor die comprising:
a substrate; and
a radio-frequency (RF) switch circuit implemented on the substrate, the RF switch circuit including a switch field-effect transistor (FET) having a gate and a body, the RF switch circuit further including a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

18. The semiconductor of claim 17 further comprising an insulator layer implemented between the switch FET and the substrate.

19. The semiconductor die of claim 18 wherein the semiconductor die is a silicon-on-insulator (SOI) die.

20. A wireless device comprising:
a transceiver configured to process RF signals;
an antenna in communication with the transceiver and configured to facilitate either or both of transmit operation and receive operation of the transceiver; and
a switching module coupled to the antenna and configured to selectively route RF signals associated with the antenna, the switch module including an RF switch circuit having a switch field-effect transistor (FET) having a gate and a body, the RF switch circuit further including a bias circuit configured to provide a bias voltage to the body of the switch FET, the bias circuit including a first FET implemented in a first diode configuration and coupled to the body of the switch FET, the bias circuit further including a compensation circuit coupled to the first FET, the compensation circuit configured to delay a gate voltage provided to the first FET to limit a voltage difference between source and drain of the first FET while allowing the body of the switch FET to transition faster between a discharged state and a charged state.

* * * * *